United States Patent
Kimura

(10) Patent No.: US 11,257,548 B2
(45) Date of Patent: Feb. 22, 2022

(54) MEMORY SYSTEM

(71) Applicant: TOSHIBA MEMORY CORPORATION, Tokyo (JP)

(72) Inventor: Naoki Kimura, Ebina Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 714 days.

(21) Appl. No.: 16/113,964

(22) Filed: Aug. 27, 2018

(65) Prior Publication Data

US 2019/0295664 A1  Sep. 26, 2019

(30) Foreign Application Priority Data

Mar. 22, 2018 (JP) .............................. JP2018-053937

(51) Int. Cl.
| | | |
|---|---|---|
| *G11C 16/30* | (2006.01) | |
| *G01R 19/165* | (2006.01) | |
| *H02H 3/20* | (2006.01) | |
| *G11C 5/14* | (2006.01) | |
| *G06F 1/30* | (2006.01) | |

(52) U.S. Cl.
CPC ............ *G11C 16/30* (2013.01); *G01R 19/165* (2013.01); *G01R 19/16533* (2013.01); *G06F 1/30* (2013.01); *G11C 5/143* (2013.01); *H02H 3/20* (2013.01)

(58) Field of Classification Search
CPC ............ G01R 19/165; G01R 19/16504; G01R 19/16519; G01R 19/16533; G01R 19/16538; G01R 19/16547; G01R 19/16552; G06F 1/26; G06F 1/30; G06F 1/305; G11C 5/143; G11C 16/30; H02H 3/20; H03K 17/302; H03K 17/30; H03K 5/08; H03K 5/082; H03K 5/084
See application file for complete search history.

(56) References Cited

U.S. PATENT DOCUMENTS

| | | | |
|---|---|---|---|
| 2014/0181565 A1 | 6/2014 | Oguro et al. | |
| 2016/0065000 A1* | 3/2016 | Maeda | G11C 5/148 307/23 |
| 2017/0292979 A1 | 10/2017 | Laird et al. | |
| 2018/0358800 A1* | 12/2018 | Sawano | H02H 1/043 |

FOREIGN PATENT DOCUMENTS

JP     2017-112738 A     6/2017

* cited by examiner

*Primary Examiner* — Long Nguyen
(74) *Attorney, Agent, or Firm* — Kim & Stewart LLP

(57) ABSTRACT

A memory system includes a connector through which power for the memory system is to be supplied from an external device, a controller, a nonvolatile memory device, a power source circuit connected to the controller and the nonvolatile memory device by power lines through which power is supplied to the controller and the nonvolatile memory device, and a power source control circuit that receives a supply of power from the external device through the connector and supplies the power to the power control circuit. The power source control circuit is configured to detect using a divided voltage of a voltage of the power supplied thereto, that the voltage of the power supplied thereto is higher than a predetermined voltage and interrupt the power supplied to the power control circuit if the voltage of the power supplied thereto is higher than the predetermined voltage.

10 Claims, 5 Drawing Sheets

MEMORY SYSTEM

CROSS-REFERENCE TO RELATED APPLICATIONS

This application is based upon and claims the benefit of priority from Japanese Patent Application No. 2018-053937, filed Mar. 22, 2018, the entire contents of which are incorporated herein by reference.

FIELD

Embodiments described herein relate generally to a memory system.

BACKGROUND

In a memory system such as a solid state drive (SSD), an input overvoltage protection circuit is integrated into a power source circuit receiving input power.

DETAILED DESCRIPTION

Figure 1:
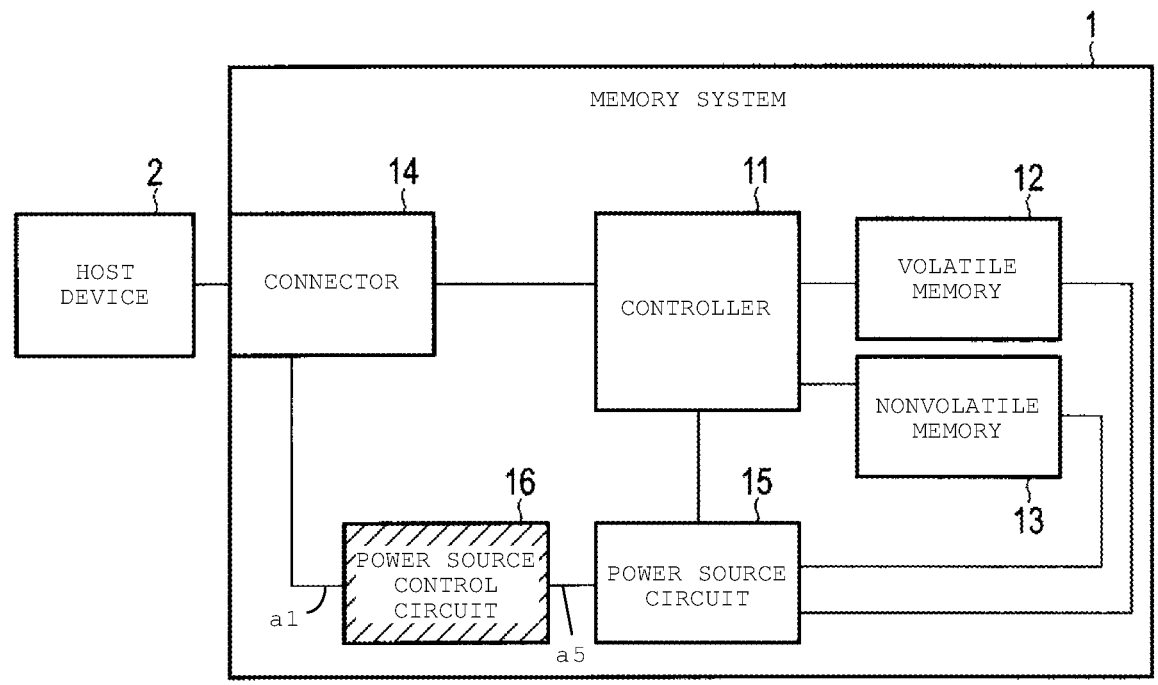
FIG. 1 is a diagram illustrating an example of a configuration of a memory system according to a first embodiment.

Embodiments provide a memory system that protects a load from a high voltage that is significantly above a standard voltage.

In general, according to one embodiment, a memory system includes a connector through which power for the memory system is to be supplied from an external device, a controller, a nonvolatile memory device, a power source circuit connected to the controller and the nonvolatile memory device by power lines through which power is supplied to the controller and the nonvolatile memory device, and a power source control circuit that receives a supply of power from the external device through the connector and supplies the power to the power control circuit. The power source control circuit is configured to detect using a divided voltage of a voltage of the power supplied thereto, that the voltage of the power supplied thereto is higher than a predetermined voltage and interrupt the power supplied to the power control circuit if the voltage of the power supplied thereto is higher than the predetermined voltage.

Hereinafter, embodiments of the present disclosure will be described with reference to the drawings. In the following description, configuration elements having substantially the same functions and configurations are denoted by the same reference numerals or symbols, and repetitive description may be omitted.

FIG. 1 is a diagram illustrating an example of a configuration of a memory system 1 according to a first embodiment. Here, it is assumed that the memory system 1 is implemented by an SSD that is used as a main storage of a host device 2. The memory system 1 is not limited to the SSD, and can be implemented by as various other types of a storage such as a hybrid disk drive. The memory system 1 may be embedded in the host device 2 or may be externally connected to the host device 2. In addition, a method of the present embodiment which will be described below can be applied to not only a storage such as an SSD but also various electronic devices.

The host device 2 is an information processing device such as a personal computer (PC) or a server. For example, PCI Express® (PCIe®) can be used as an interface for interconnecting the memory system 1 and the host device 2.

As illustrated in FIG. 1, the memory system 1 includes a controller 11, a volatile memory 12, a nonvolatile memory 13, a connector 14, a power source circuit 15, and a power source control circuit 16.

The controller 11 receives a write or a read command from a host device 2, writes data transferred from the host device 2 to the nonvolatile memory 13 in response to the write command, and reads data, which is requested from the host device 2, from the nonvolatile memory 13 in response to the read command, while using the volatile memory 12 as a cache. The controller 11 is, for example, a system on chip (SoC) in which a central processing unit (CPU) is embedded. A program for causing the memory system 1 to perform a target operation is stored in a predetermined area of the nonvolatile memory 13. The program is partially or entirely loaded into the volatile memory 12, for example, when the memory system 1 is activated, and is executed by the CPU in the controller 11.

The volatile memory 12 is, for example, a dynamic random access memory (RAM) (DRAM). In addition, the nonvolatile memory 13 is, for example, a NAND type flash memory. Here, it is assumed that the memory system 1 includes the volatile memory 12, but a configuration without the volatile memory 12 can also be assumed. For example, a configuration in which a storage corresponding to the volatile memory 12 is embedded in the controller 11 can also be assumed.

The connector 14 has a shape conforming to, for example, the PCIe standard, and is a connection unit that connects the host device 2 to the memory system 1. A read command, a write command, user data, and the like from the host device 2 are transferred to the controller 11 via the connector 14. In addition, user data read from the nonvolatile memory 13, a response from the controller 11, or the like is transferred to the host device 2 via the connector 14.

The power source circuit 15 is, for example, a power management IC (PMIC) that supplies power to each component (the controller 11, the volatile memory 12, and the nonvolatile memory 13) in the memory system 1 under the control of the controller 11. The power source circuit 15 is connected to the host device 2 via the connector 14 and the power source control circuit 16, and receives power from the host device 2. The power source circuit 15 is connected to the controller 11, the volatile memory 12 and the nonvolatile memory 13 by power source lines illustrated in FIG. 1, and can supply the power supplied from the host device 2 to the controller 11, the volatile memory 12, and the nonvolatile memory 13 through these power source lines.

The power source control circuit 16 is interposed between the connector 14 and the power source circuit 15. The power source control circuit 16 is a control circuit for handling an overvoltage condition, in preparation for an abnormal situation in which a voltage significantly exceeding a rated voltage of the memory system 1 including the power source circuit 15, is applied. For example, there is an erroneous insertion of an AC adapter on the host device 2 side as a cause of the abnormal situation. If the voltage significantly exceeding the rated voltage of the power source circuit is applied, the power source circuit is damaged, and thereby, an input overvoltage protection circuit built in the power source circuit does not operate. Thereby, it is impossible to protect electronic circuits to which the power source circuit supplies power.

The power source control circuit 16 adaptively disconnects the power source line connecting the connector 14 to the power source circuit 15 so as to protect the electronic circuits, more specifically, the power source circuit 15 and each component (the controller 11, the volatile memory 12, and the nonvolatile memory 13) of the memory system 1. The memory system 1 according to the present embodiment includes the power source control circuit 16 that protects the electronic circuits from a high voltage that is significantly above a standard voltage. Hereinafter, the power source control circuit 16 will be described in detail.

Figure 2:
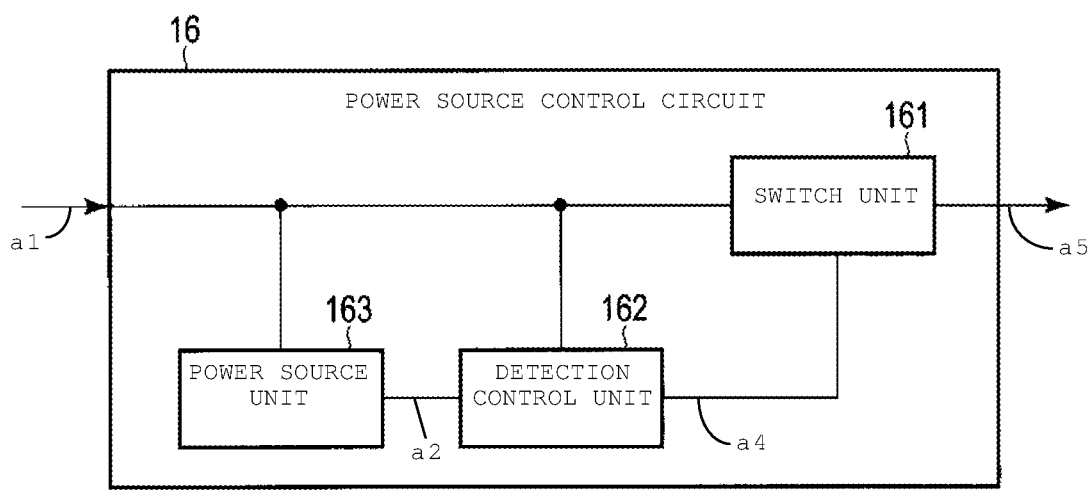
FIG. 2 is a block diagram schematically illustrating an example of a configuration of a power source control circuit according to the first embodiment.

FIG. 2 is a block diagram schematically illustrating an example of a configuration of the power source control circuit 16 according to the first embodiment.

As illustrated in FIG. 2, the power source control circuit 16 according to the present embodiment includes a switch unit (which is a switch circuit) 161, a detection control unit (which is a logic circuit) 162, and a power source unit (which is a regulator circuit) 163.

The switch unit 161 switches ON/OFF states with respect to an input power a1 input from the host device 2 received via the connector 14. The switch unit 161 is normally in an ON state. In a case where the input power a1 is higher than a predetermined voltage, the switch unit 161 is changed to the OFF state by a control output a4 received from the detection control unit 162. In a case where a voltage of the input power a1 exceeds maximum rated voltages of each component in the power source circuit 15 and the memory system 1, the switch unit 161 disconnects the power source line with respect to a load before the voltage of the input power a1 reaches a value by which the power source circuit 15 and each component of the memory system 1 are damaged.

In order to detect an abnormality (e.g., a voltage higher than a predetermined voltage) of the power input from the host device 2, the detection control unit 162 detects that a voltage obtained by dividing the power input from the host device 2 exceeds a threshold value. The detection control unit 162 controls the switch unit according to a detection result. The detection control unit 162 receives the voltage obtained by dividing the input power a1 by resistors (a first resistor R2 and a second resistor R3) as a detection signal (a detection input a3). The detection control unit 162 inverts an output (control output a4) for the switch unit 161 before the voltage of the input power reaches a value by which the power source circuit 15 and each component of the memory system 1 are damaged, based on the detection input a3. The threshold value which is compared with the detection input a3 and serves as a reference value for inverting the control output a4 is set so as to correspond to a voltage value of the detection signal when a voltage value of the input power a1 reaches a value that can be determined to be abnormal.

Here, the detection input a3 that is input to the detection control unit 162 is a voltage obtained by dividing the input power a1 by a resistor. Accordingly, by adjusting resistance values of the resistors R2 and R3, the voltage of the detection input a3 can be adjusted so as to be included within a certain range even in a case where the voltage of the input power a1 significantly exceeds the rated voltage of the memory system 1.

The detection control unit 162 is a low voltage operation gate that operates even at a voltage lower than the rated voltage of the memory system 1. The detection control unit 162 needs to function before the power source circuit 15 and each component of the memory system 1 start an operation. Accordingly, the power source unit 163 that supplies power to the detection control unit 162 operates even at a voltage lower than the rated voltage of the memory system 1 and is not damaged even at a voltage significantly exceeding the rated voltage of the memory system 1. A more detailed configuration of the power source unit 163 will be described below.

Figure 3:
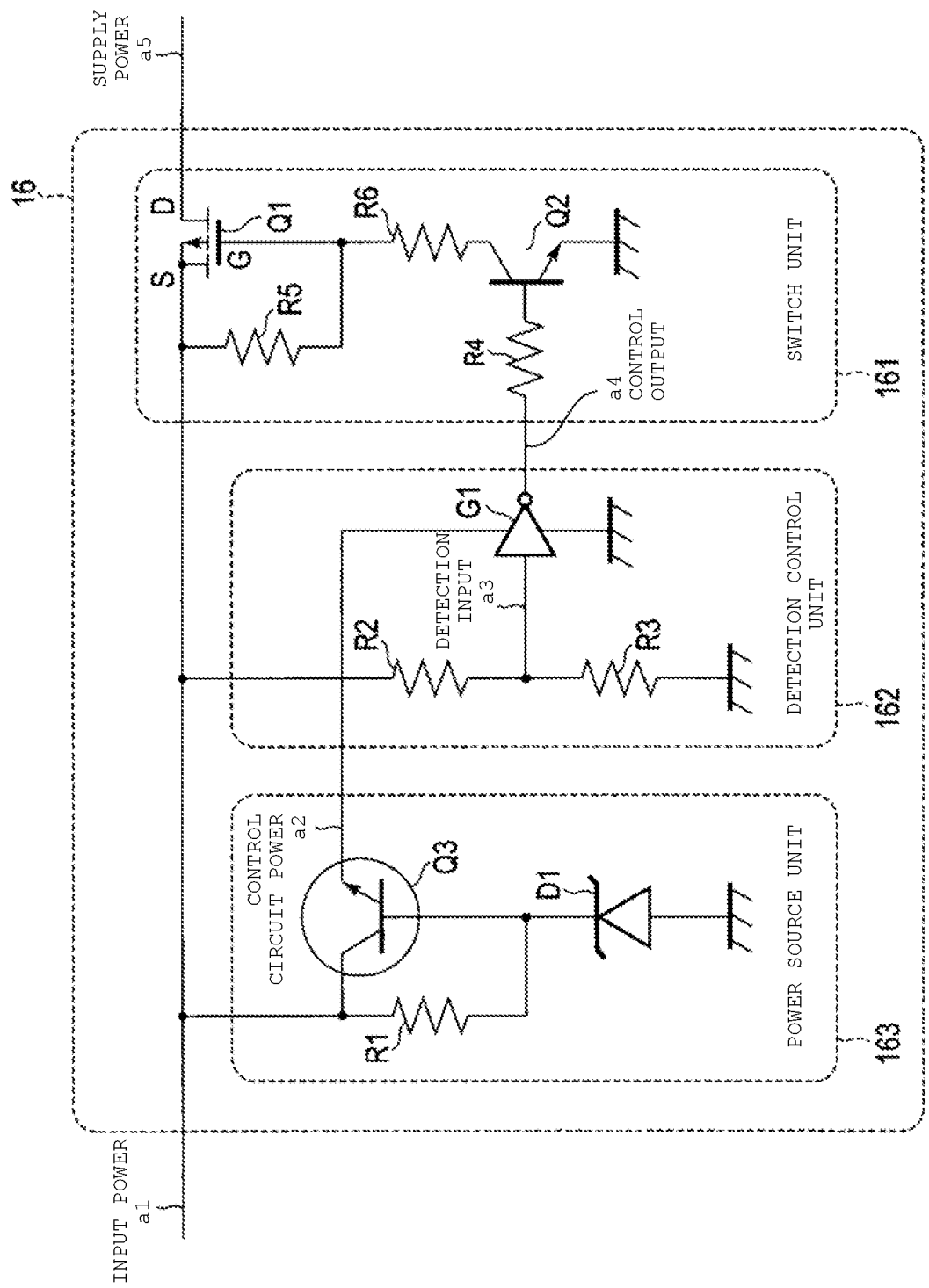
FIG. 3 is a diagram illustrating a first configuration example of the power source control circuit according to the first embodiment.
Figure 4:
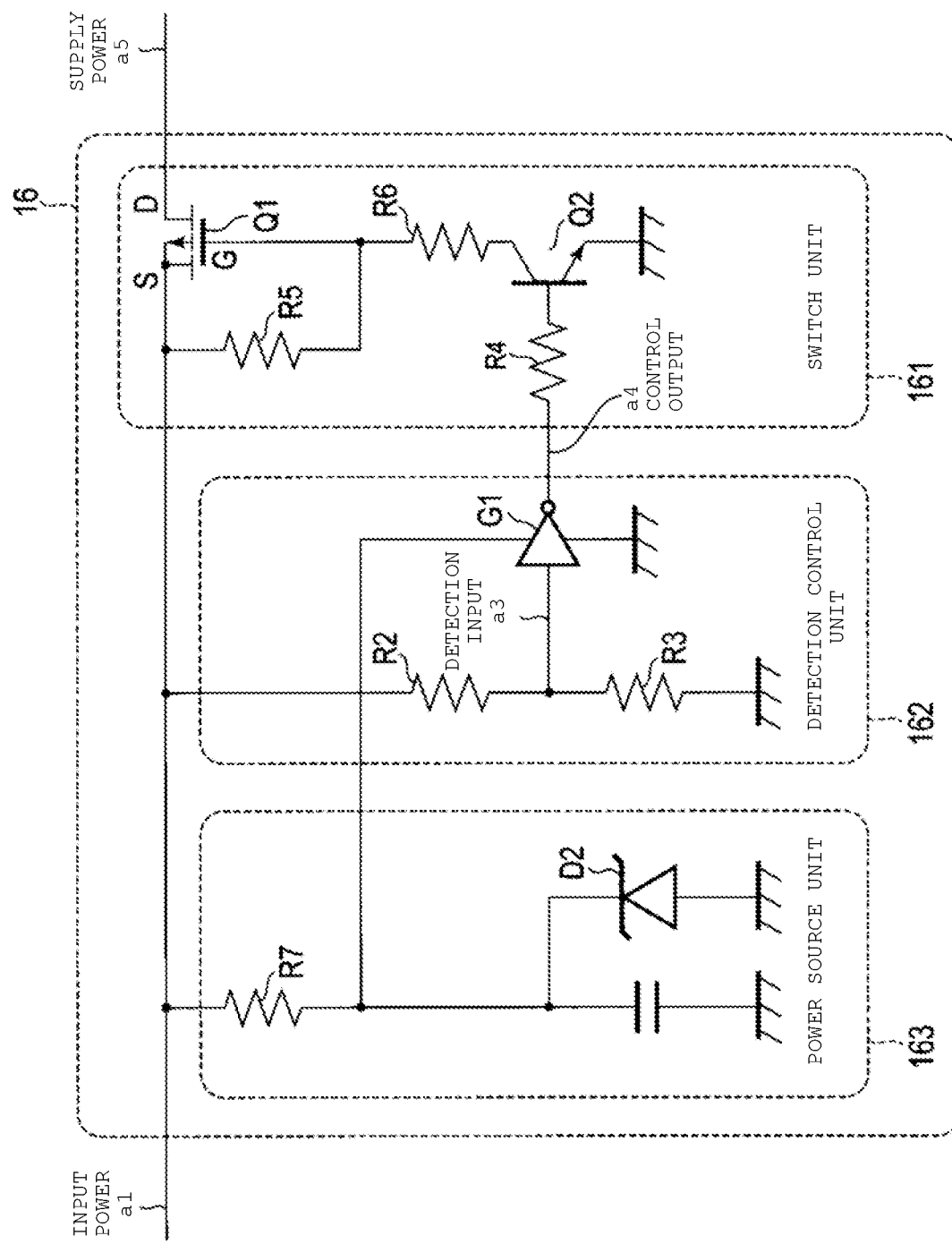
FIG. 4 is a diagram illustrating a second configuration example of the power source control circuit according to the first embodiment.

Next, an operation of the power source control circuit 16 will be described with reference to FIGS. 3 and 4. FIG. 3 is a diagram illustrating a first example configuration of the power source control circuit 16 according to the first embodiment. FIG. 4 is a diagram illustrating a second configuration example of the power source control circuit 16 according to the first embodiment.

In FIG. 3, the input power a1 is a power supplied from the host device 2 side via the connector 14. The rated voltage (for example, +3.3 V) of the memory system 1 is supposed to be supplied as the input power a1. In addition, the control circuit power a2 is a power generated using the input power a1 by the power source unit 163, and is a power used for an operation of the detection control unit 162. The control circuit power a2 is set to a voltage lower than the rated voltage of the memory system 1.

The power source unit 163 generates control circuit power a2 for an operation of the detection control unit 162 using the power input from the host device 2. The power source unit 163 includes a constant voltage circuit. For example, the constant voltage circuit includes an NPN transistor Q3, a constant voltage element (e.g., Zener diode) D1, and a resistor R1 as illustrated in FIG. 3. In addition to this, the constant voltage circuit can include a constant voltage element D2 and a resistor R7 as illustrated in FIG. 4.

The power source unit 163 generates a constant voltage of approximately 2 V using the input power a1, and outputs the voltage as the control circuit power a2. That is, the power source unit 163 generates the control circuit power a2. In addition, since the power source unit 163 generates a constant voltage of approximately 2 V using a circuit having a simple configuration, even if a voltage of the input power a1 significantly exceeds the rated voltage of the memory system 1, the power source unit is not damaged.

The detection control unit 162 includes an inverter G1 and resistors R2 and R3. A voltage of the detection input a3 input to the inverter G1 is a voltage obtained by dividing the input power a1 by the resistors R2 and R3. For example, in a case where the resistor R2 is 47 kΩ and the resistor R3 is 10 kΩ, if a supply voltage is 10 V, the detection input a3 becomes 1.75 V. An output (control output a4) of the inverter G1 is set so as to be inverted (H→L) before the input power a1 reaches such a voltage that damages each component of the memory system 1. That is, if a voltage value of the detection input a3 exceeds a threshold value, the detection control unit 162 performs inversion (H→L) of the control output a4 in the inverter G1.

The switch unit 161 includes, for example, an FET Q1 and a control transistor Q2. The switch unit 161 further includes resistors R4, R5, and R6. The FET Q1 is configured with, for example, a P-type MOS-FET. The control transistor Q2 receives control output a4 of the inverter G1 (via the resistor R4) and switches ON/OFF states accordingly. The switch unit 161 switches the ON/OFF states with respect to the input power a1 via the control transistor Q2.

The control transistor Q2 is, for example, an NPN transistor. In a case where the control transistor Q2 is an NPN transistor, when the control output a4 is H, the control transistor Q2 enters the ON state. In addition, in a case where the control transistor Q2 is an NPN transistor, when the control output a4 is L, the control transistor Q2 enters the OFF state.

In addition, the control transistor Q2 may be, for example, an N-type MOS-FET instead of the NPN transistor. In a case where the control transistor Q2 is an N-type MOS-FET, when the control output a4 is H, the control transistor Q2 enters the ON state. In addition, in a case where the control transistor Q2 is an N-type MOS-FET, when the control output a4 is L, the control transistor Q2 enters the OFF state.

In a case where the control transistor Q2 is turned on, the resistor R6 is grounded and a gate voltage of the FET Q1 is lower than a voltage of a source, and thereby, a source is connected to a drain. Thereby, the input power a1 is supplied to the power source circuit 15 at a subsequent stage as a supply power a5. Accordingly, the switch unit 161 enters an ON state.

In a case where the control transistor Q2 is turned off, the resistor R6 is not grounded, and thereby, the gate and the source of the FET Q1 are at the same potential and the drain is disconnected from the source. Thereby, the input power a1 is not supplied to the power source circuit 15 at the subsequent stage. That is, supplying the supply power a5 to the power source circuit 15 is interrupted. Accordingly, the switch unit 161 enters an OFF state.

In addition, the switch unit 161 may include other switch mechanisms in another configuration, instead of the FET Q1 and the control transistor Q2. With the other switch mechanism, the switch unit 161 receives the control output a4 of the inverter G1 and switches ON/OFF states with respect to the input power a1 in accordance with the control output a4.

Figure 5A:
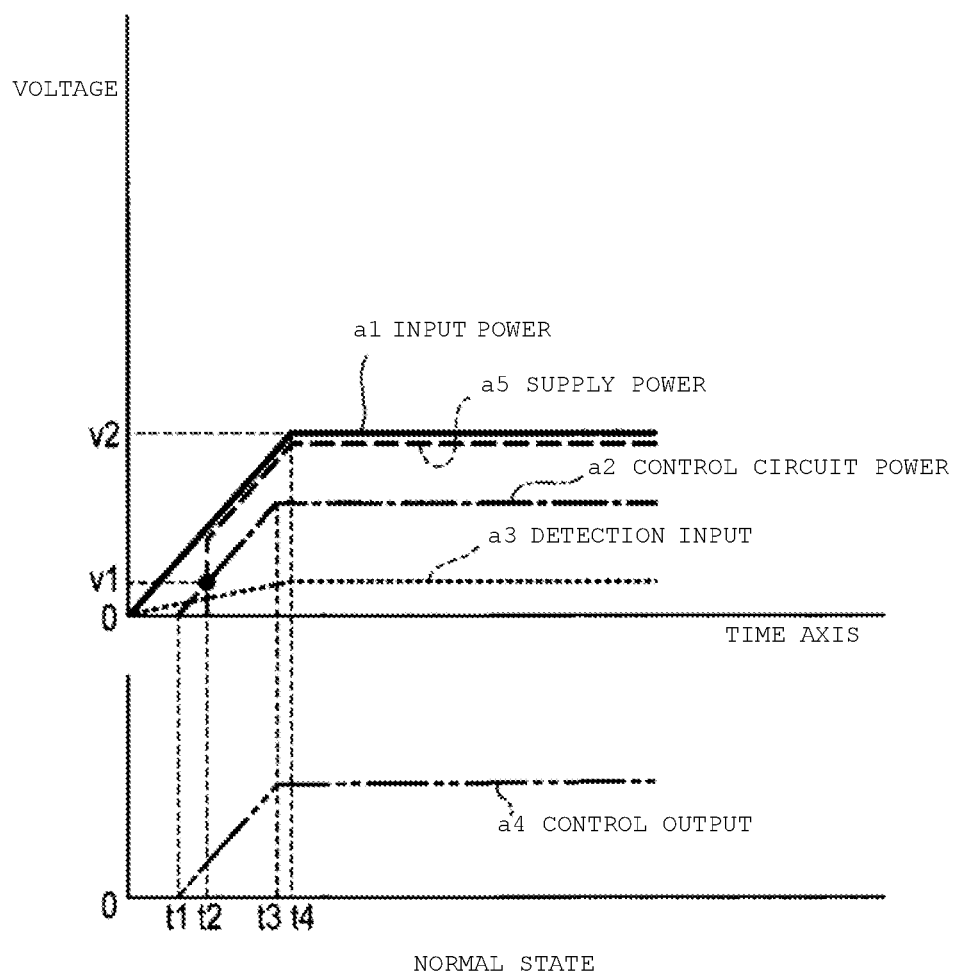
FIG. 5A is a diagram illustrating an example of a power source waveform at the time of a normal state in the memory system according to the embodiment.
Figure 5B:
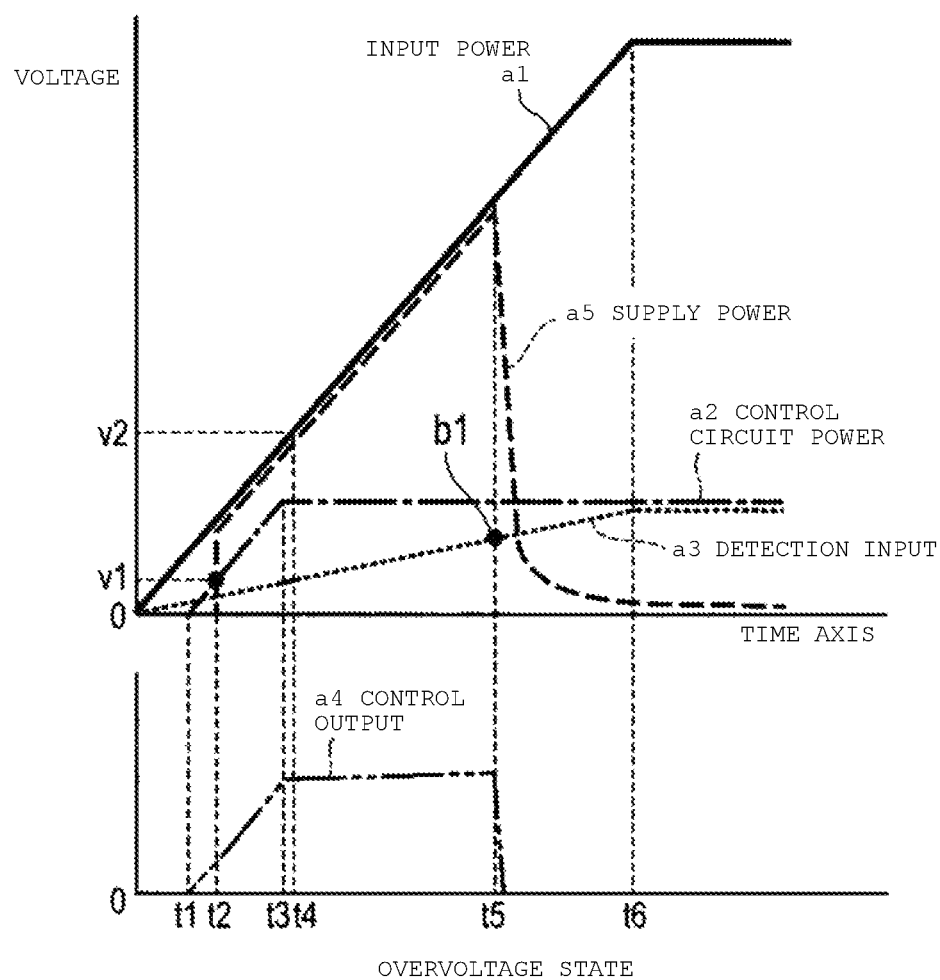
FIG. 5B is a diagram illustrating an example of a power source waveform at the time of an overvoltage state in the memory system according to the embodiment.

FIG. 5A is a diagram illustrating an example of a power source waveform at the time of a normal state in the memory system according to the first embodiment, and FIG. 5B is a diagram illustrating an example of a power source waveform at the time of an overvoltage state in the memory system according to the first embodiment. A vertical axis denotes a voltage and a horizontal axis denotes time. A vertical axis v1 indicates a voltage at which the detection control unit 162 can operate, and v2 indicates a rated voltage of the memory system. The labels t1 to t6 on the horizontal axis denote time.

In a normal state, for example, in a case where the memory system 1 is an M.2 type SSD having a rated voltage of 3.3 V±5%, +3.3V which is within a rated voltage range is supplied as the input power a1, and in the same manner, for example, in a case where the memory system 1 is a 2.5 inch type SSD, +5 V which is within the rated voltage range is supplied as the input power a1. Meanwhile, when an overvoltage occurs, for example, in a case where the memory system 1 is an SSD of the former type with the rated voltage of 3.3 V±5%, +5 V which is out of the rated voltage range is supplied as the input power a1, and in the same manner, for example, in a case where the memory system 1 is an SSD of the latter type, +12 V which is out of the rated voltage range is supplied as the input power a1.

As illustrated in FIG. 5A, in the normal state, a voltage value of the input power a1 increases after the supplying is started, and a voltage value of the control circuit power a2 that is generated by using the input power a1 also increases with a slight delay (t1 to t3). Voltage values of the detection input a3 (0 to t4), the control output a4 (t1 to t3), and the supply power a5 (t2 to t4) increase as the voltage value of the input power a1 increases. In addition, until the voltage value of the input power a1 increases up to the rated voltage (v2) of the memory system 1, the switch unit 161 is in the ON state (t2 to t4).

Before a voltage value of the input power a1 increases up to the rated voltage (v2) of the memory system 1, a constant voltage control of the control circuit power a2 made by the power source unit 163 is completed (t3). Thereby, a stable operation of the detection control unit 162 is started. That is, the detection control unit 162 functions before the power source circuit 15 and each component (the controller 11, the volatile memory 12, and the nonvolatile memory 13) of the memory system 1 start operations. If the detection input a3 obtained by dividing the input power a1 does not exceed the threshold value, the detection control unit 162 does not perform an inversion (H→L) of the control output a4.

Thereafter, the voltage value of the control circuit power a2 is kept at a constant value (t3 to t4) even if the voltage value of the input power a1 continuously increases. If the voltage value of the input power a1 increases up to the rated voltage (v2) of the memory system 1, the memory system stabilizes at the value (t4). Accordingly, the detection input a3 obtained by dividing the input power a1 does not exceed the threshold value, and the detection control unit 162 does not perform the inversion (H→L) of the control signal a4. Thus, the switch unit 161 is kept in the ON state. As the result, supply power a5 to the power source circuit 15 is maintained.

As illustrated in FIG. 5B, even when the overvoltage occurs, the voltage value of the input power a1 increases after the supplying is started, and the voltage value of the control circuit power a2 that is generated by using the input power a1 also increases with a slight delay (t1 to t3), in the same manner as in the normal state. The voltage values of the detection input a3 (0 to t4), the control output a4 (t1 to t3), and the supply power a5 (t2 to t4) increase as the voltage value of the input power a1 increases. In addition, until the voltage value of the input power a1 increases up to the rated voltage (v2) of the memory system 1, the switch unit 161 is in the ON state (t2 to t4).

In addition, even when the overvoltage occurs, the constant voltage control of the control circuit power a2 made by the power source unit 163 is completed (t3) before the voltage value of the input power a1 increases up to the rated voltage (v2) of the memory system 1, in the same manner as in the normal state.

Thereafter, the voltage value of the control circuit power a2 is kept at a constant value (t3 to t4) even if the voltage value of the input power a1 continuously increases.

Meanwhile, when the overvoltage occurs, the voltage value of the input power a1 continuously increases as it is (t4 to t6) even if the voltage value increases up to the rated voltage (v2) of the memory system 1, unlike the normal state. That is, the voltage value of the detection input a3 which is the voltage obtained by dividing the input power a1 also continuously increases (t4 to t6). If the voltage value of the detection input a3 exceeds the threshold value (t5), the detection control unit 162 performs the inversion (H→L) of the control output a4. Thus, the switch unit 161 changes to the OFF state. As the result, the supply of power a5 to the power source circuit 15 is interrupted.

A voltage significantly exceeding the rated voltage of the power source circuit 15 such that the power source circuit 15 is damaged may be prevented from being applied to the power source circuit 15 by interrupting the supply of the supply power a5. That is, it is possible to protect a load from a high voltage that is significantly above a standard voltage.

Furthermore, as illustrated in FIGS. 5A and 5B, the detection control unit 162 operates at the voltage (v1) lower than the rated voltage (v2) of the memory system 1, and thus, control of the switch unit 161 may start (t2) before the input power a1 reaches the rated voltage (v2) of the memory system 1.

In addition, as illustrated in FIG. 3, the input power a1 is divided by the detection control unit 162 and is input to the inverter G1 in the detection control unit 162 as the detection input a3. Accordingly, even in a case where a voltage of the input power significantly exceeds the rated voltage of the memory system 1, it is possible to adjust the detection control unit 162 such that the detection control unit 162 is not damaged.

In addition, as described above, the power source unit 163 is configured so as not to be damaged even by a voltage significantly exceeding the rated voltage of the memory system 1, and the detection control unit 162 operates by using power generated by the power source unit 163 configured in this way and the detection input a3 obtained by dividing the input power a1. Accordingly, even if the voltage value of the input power a1 significantly exceeds, for example, the rated voltage of the memory system 1, there is no trouble in the operation of the detection control unit 162 in view of power.

As described above, the memory system 1 according to the embodiment protects a load from a high voltage out of a standard.

Figure 6:
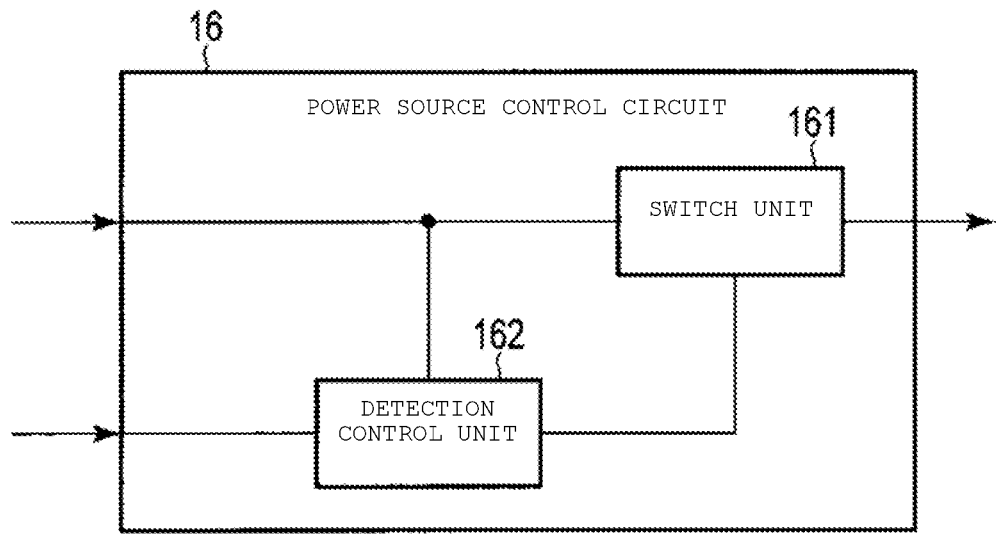
FIG. 6 is a block diagram schematically illustrating an example of a configuration of a power source control circuit according to a second embodiment.

FIG. 6 is a block diagram schematically illustrating an example of a configuration of the power source control circuit 16 according to a second embodiment.

As illustrated in FIG. 6, the power source control circuit 16 according to the present embodiment includes the switch unit (which is a switch circuit) 161 and the detection control unit (which is a logic circuit) 162. The second embodiment is different from the first embodiment in that the detection control unit 162 operates using another power supplied from the outside of the power source control circuit 16. According to this, the power source unit 163 does not exist in the second embodiment.

According to the second embodiment, with such a configuration, there is no trouble in an operation of the detection control unit 162 that operates using the other power and the detection input a3 obtained by dividing the input power a1, even if the voltage value of the input power a1 significantly exceeds, for example, the rated voltage of the memory system 1. The other points are the same as in the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    a connector through which first power for the memory system is to be supplied from an external device;
    a controller;
    a nonvolatile memory device;
    a power source circuit connected to the controller by a first power line through which power is supplied to the controller and connected to the nonvolatile memory device by a second power line through which power is supplied to the nonvolatile memory device; and
    a control circuit provided between the connector and the power source circuit, wherein the control circuit is configured to
    receive the first power through the connector,
    detect that a divided voltage of a voltage of the received first power is higher than a threshold voltage, supply the first power to the power source circuit if the divided voltage is lower than the threshold voltage, and interrupt the first power from being supplied to the power source circuit if the divided voltage is higher than the threshold voltage.

2. The memory system according to claim 1, wherein the control circuit includes
    a power source unit configured to generate second power from the received first power; and
    a detection control unit configured to operate using the second power to detect that the divided voltage is higher than the threshold voltage.

3. The memory system according to claim 2, wherein the control circuit further includes a switch element that is controlled on or off by a control output of the detection control unit, the control output turning the switch element on if the divided voltage is lower than the threshold voltage and turning the switch element off if the divided voltage is higher than the threshold voltage.

4. The memory system according to claim 2,
    wherein the detection control unit comprises a resistor for generating the divided voltage to generate a detection signal.

5. The memory system according to claim 4,
    wherein, in a case where a voltage value of the detection signal exceeds a threshold value, the detection control unit controls the switch element to turn off.

6. The memory system according to claim 5,
    wherein, when a voltage value of the first power reaches a value that is capable of being determined to be abnormal, the voltage value of the detection signal corresponds to the threshold value.

7. The memory system according to claim 6,
    wherein the detection control unit comprises a gate that inverts an output in a case where the voltage value of the detection signal exceeds the threshold value.

8. The memory system according to claim 2,
    wherein the power source unit is configured to generate the second power by a circuit which includes at least a constant voltage element and a resistor, and which produces a constant voltage.

9. The memory system according to claim 3,
    wherein the switch element comprises a P-type MOS-FET that is turned on or off according to the control output.

10. The memory system according to claim 1,
    wherein the power source circuit is configured to generate operation power for each component of the memory system including the controller and the nonvolatile memory device, using the first power.

\* \* \* \* \*